United States Patent
Moriwaki

(10) Patent No.: US 8,304,781 B2
(45) Date of Patent: Nov. 6, 2012

(54) CIRCUIT BOARD PROVIDED WITH MONOLITHIC CIRCUIT HAVING THIN FILM TRANSISTOR ON SUBSTRATE, AND DISPLAY DEVICE HAVING THE CIRCUIT BOARD

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 201 days.

(21) Appl. No.: 12/595,366

(22) PCT Filed: Apr. 25, 2008

(86) PCT No.: PCT/JP2008/058121
§ 371 (c)(1),
(2), (4) Date: Oct. 9, 2009

(87) PCT Pub. No.: WO2009/028235
PCT Pub. Date: Mar. 5, 2009

(65) Prior Publication Data
US 2010/0051959 A1    Mar. 4, 2010

(30) Foreign Application Priority Data
Aug. 24, 2007  (JP) .................. 2007-218769

(51) Int. Cl.
H01L 27/14   (2006.01)
H01L 29/04   (2006.01)
H01L 29/15   (2006.01)
H01L 31/036  (2006.01)

(52) U.S. Cl. .............. 257/72; 257/59; 438/149

(58) Field of Classification Search .......... 257/223, 257/227, 291, 292, 439, 443, 655, 270, 288, 257/327, 252, 253, 254, 257, 258, 57, 59, 257/72, 83, 290, 351, 368, 392; 438/149, 438/277, 280, 284, 283, 197, 30, 48, 128, 438/151, 157, 22, 24
See application file for complete search history.

(56) References Cited

U.S. PATENT DOCUMENTS

| | | | |
|---|---|---|---|
| 6,190,933 B1 * | 2/2001 | Shimabukuro et al. | 438/30 |
| 6,255,148 B1 | 7/2001 | Hara et al. | |
| 6,582,996 B1 | 6/2003 | Hara et al. | |
| 2001/0041391 A1 | 11/2001 | Hara et al. | |
| 2002/0096681 A1 * | 7/2002 | Yamazaki et al. | 257/66 |
| 2003/0190777 A1 | 10/2003 | Hara et al. | |
| 2003/0207503 A1 * | 11/2003 | Yamazaki et al. | 438/149 |
| 2005/0236692 A1 | 10/2005 | Hara et al. | |

(Continued)

FOREIGN PATENT DOCUMENTS

JP   4-30475   2/1992

(Continued)

*Primary Examiner* — Ha Tran T Nguyen
*Assistant Examiner* — Thanh Y Tran
(74) *Attorney, Agent, or Firm* — Birch, Stewart, Kolasch & Birch, LLP

(57) ABSTRACT

A circuit board including high-performance thin film transistors whose characteristics are hardly varied thereamong in a monolithic circuit, and a display device including the circuit board are provided. The circuit board includes a monolithic circuit including a thin film transistor on a substrate, wherein the thin film transistor includes a semiconductor layer, a gate insulating film, and a gate electrode, stacked in this order, a portion where the gate electrode overlaps with the semiconductor layer has an area of 40 $\mu m^2$ or less, and the gate electrode has a thickness of 300 nm or less.

6 Claims, 6 Drawing Sheets

U.S. PATENT DOCUMENTS

| | | | |
|---|---|---|---|
| 2006/0119548 A1* | 6/2006 | Lan et al. | 345/76 |
| 2006/0172497 A1* | 8/2006 | Hareland et al. | 438/286 |
| 2007/0085169 A1 | 4/2007 | Hara et al. | |
| 2008/0029821 A1* | 2/2008 | Yamagami et al. | 257/365 |

FOREIGN PATENT DOCUMENTS

| | | |
|---|---|---|
| JP | 4-30475 A | 2/1992 |
| JP | 2001-144300 A | 5/2001 |
| JP | 2002-170956 A | 6/2002 |

* cited by examiner

CIRCUIT BOARD PROVIDED WITH MONOLITHIC CIRCUIT HAVING THIN FILM TRANSISTOR ON SUBSTRATE, AND DISPLAY DEVICE HAVING THE CIRCUIT BOARD

CROSS REFERENCE

The present application claims priority to Patent Application No. 2007-218769 filed in Japan on Aug. 24, 2007 under the Paris Convention and provisions of national law in a designated State, the entire contents of which are hereby incorporated by reference.

BACKGROUND OF THE INVENTION

1. Field of the Invention

The present invention relates to a circuit board and a display device. More particularly, the present invention relates to a full monolithic circuit board and a display device including such a circuit board.

2. Description of the Related Art

The market of a flat panel display is now being expanded with highly-advanced informatization. Flat panel displays such as a non-self-emitting liquid crystal display (LCD), a self-emitting plasma display (PDP), an inorganic electroluminescent (inorganic EL) display, and an organic electroluminescent (organic EL) display, are known, and such displays are being actively researched and developed.

According to conventional display devices, a driving circuit and the like is mounted outside a display panel, and a thin film transistor (TFT) that is formed in the panel is typically used for pixel switching. In recent years, a display device including a monolithic circuit board, where a driving circuit and the like is arranged on a substrate inside the panel, is being researched and developed. TFTs included in such a display device need to have higher characteristics than those of TFTs included in the conventional display devices.

In the full monolithic circuit board, TFTs need to have higher performances than those of TFTs for pixel switching, and characteristics need to be hardly varied among the TFTs. So TFTs having such transistor characteristics are being researched and developed. As a typical way of improving performances of the TFTs, the gate wiring is designed to be as thick as possible for reduction in resistance.

A technology of reducing a resistance of a gate wiring in a TFT used for pixel electrode switching by providing the gate wiring with a two-layer structure is disclosed (for example, see Patent Document 1). According to this technology, the TFT, which is used as a switching element for a pixel electrode, includes a base coat film 111, a semiconductor layer 112, a gate insulating film 113, a gate electrode 114, and an interlayer film 116, stacked in this order on a glass substrate 110, as shown in FIG. 10. As shown in FIG. 11, the gate wiring portion is formed to have a two-layer structure composed of a first gate wiring 115 as a lower layer and a second gate wiring 118 as an upper layer, which can reduce the resistance of the gate wiring portion.

PATENT DOCUMENT 1

Japanese Kokai Publication No. Hei-04-30475

SUMMARY OF THE INVENTION

The present invention has been made in view of the above-mentioned state of the art. The present invention has an object to provide a circuit board that includes high-performance thin film transistors whose characteristics are hardly varied thereamong in a monolithic circuit and also provide a display device including the circuit board.

The inventor of the present invention made various investigations of a circuit board that is included in a monolithic display panel and that includes TFTs whose characteristics are hardly varied thereamong in a monolithic circuit on a substrate. The inventor noted that a threshold voltage shift and a significant reduction in on-state current of TFTs are generated when a gate electrode and a semiconductor layer are formed in such a way that a portion where they overlap with each other has a small area with the aim of improving performances (reduction in electric power consumption and increase in driving speed) of the TFTs used in the monolithic circuit portion. The inventor found that the threshold voltage shift and the significant reduction in on-state voltage are attributed to that fixed charge is stored in a gate insulating film in a channel region by plasma etching for patterning the gate electrode. Further, the inventor found that even if the portion where the gate electrode overlaps with the semiconductor layer has an area of 40 μm² or less, the time for plasma etching can be shortened because of 300 nm or less of the thickness of the gate electrode, and the generation of fixed charge in the gate insulating film can be suppressed. As a result, a variation in characteristics among the TFTs can be suppressed. As a result, the above-mentioned problems have been admirably solved, leading to completion of the present invention.

That is, the present invention is a circuit board including a monolithic circuit including a thin film transistor on a substrate, wherein the thin film transistor includes a semiconductor layer, a gate insulating film, and a gate electrode, stacked in this order, a portion where the gate electrode overlaps with the semiconductor layer has an area of 40 μm² or less, and the gate electrode has a thickness of 300 nm or less.

The present invention is mentioned in more detail below.

The circuit board of the present invention includes a monolithic circuit including TFTs on a substrate. The monolithic circuit is not especially limited as long as it is a circuit that is used for driving control of a device including this circuit board. Examples thereof include a protection circuit, a buffer circuit, a digital to analog converter circuit (DAC circuit), a shift register, and a sampling memory, each constituting a driver circuit.

The above-mentioned thin film transistor includes a semiconductor layer, a gate insulating film, and a gate electrode, stacked in this order. The term "gate electrode" used herein means one of three electrodes constituting the TFT and it modulates the amount of electric charge that is induced in the semiconductor layer by a voltage applied to the gate electrode, thereby controlling electric current that is carried between a source and a drain.

The portion where the gate electrode overlaps with the semiconductor layer has an area of 40 μm² or less. The gate electrode has a thickness of 300 nm or less. In order to improve performances of the TFT, it is necessary to improve an integration degree of the monolithic circuit portion, and so the area of the portion where the gate electrode overlaps with the semiconductor layer when viewed in plane (hereinafter, also referred to as an "overlapping area") needs to be decreased. The decrease in the overlapping area leads to a reduction in size of the TFT. As a result, the area where the circuit is arranged can be decreased. Further, if such a circuit board is applied in a monolithic display panel, an area of a frame portion that is positioned outside a display portion can be decreased, which leads to reduction in area of the frame portion. In addition, in a TFT having a smaller overlapping area of two TFTs having the same channel width (gate width) but different overlapping areas, the channel length (gate length) can be shortened. This allows the threshold voltage of the transistor to be reduced, and also allows the electrical consumption to be decreased. In addition, the channel length is shortened, and so the resistance of the channel region can be reduced. This permits higher-speed circuit driving, and further, the circuit can be more monolithically formed. However, when the gate electrode is patterned by plasma etching, and the like, fixed charge is stored in the gate insulating film, resulting in variation in characteristics among TFTs. This is markedly observed when the overlapping area is 40 $\mu m^2$ or less. This is because if the overlapping area is small and if the gate electrode is patterned by plasma etching and the like, a surface area per unit volume of a portion to be subjected to the etching of a resist film formed on a film that is to constitute the gate electrode is increased. The storage of electric charge in the resist film by the plasma etching induces electric charge of the gate electrode. In addition, the gate electrode is charged, and thereby fixed charge is considered to be generated in the gate insulating film. If the thickness of the gate electrode is reduced to 300 nm or less, the time for plasma etching of the gate electrode can be shortened, and the generation of electric charge by the plasma etching can be suppressed. As a result, a circuit board including high-performance TFTs whose characteristics are hardly varied thereamong can be provided. The thickness of the gate electrode is reduced to 300 nm or less, and thereby for example, in a region where the gate wiring overlaps with the source wiring, disconnection of the source wiring can be suppressed. In addition, the gate electrode is formed to have a small thickness, which can shorten the times taken to form the gate electrode and to perform etching. As a result, the tact time can be reduced. In order to more improve the characteristics of the TFTs, it is more preferable that the overlapping area is 30 $\mu m^2$ or less, and it is still more preferable that the overlapping area is 20 $\mu m^2$ or less. If the overlapping area is 30 $\mu m^2$ or less, the characteristics tend to be more varied among the TFTs, which might cause malfunction of a latch circuit that is driven by a low voltage driving circuit, and the like. In the present invention, the thickness of the gate electrode is 300 nm or less, and so the characteristics are hardly varied among the TFTs. However, if the overlapping area is 20 $\mu m^2$ or less, the characteristics tend to be more varied among the TFTs. In the present invention, the thickness of the gate electrode is 300 nm or less, and so the characteristics are hardly varied among the TFTs. The term "thickness of gate electrode" used herein means the maximum thickness of the film constituting the gate electrode.

It is preferable that the gate electrode is patterned by dry etching. It is considered that the electric charge is stored in the gate insulating film due to dry etching using plasma and the like. According to the present invention, even if the gate electrode is patterned by dry etching, TFTs whose characteristics are hardly varied can be provided because the overlapping area is 40 $\mu m^2$ or less and the thickness of the gate electrode is 300 nm or less. The dry etching permits the gate electrode to be finely patterned compared with wet etching. As a result, the gate electrode can be formed to have a shape vertical to the substrate face, not a taper shape (a shape inclined to the substrate face). A line-width control property, and the like, which is important to the transistor characteristics, can be improved. Preferable embodiments of the present invention are mentioned below in more detail.

It is preferable that the gate electrode has a thickness of 200 nm or less. According to this, when the gate electrode is patterned by plasma etching and the like, the etching time can be shortened. Therefore, the variation in characteristics among the TFTs, attributed to that the fixed charge is stored in the gate insulating film, can be more suppressed.

It is preferable that the circuit board includes a gate wiring connected to the gate electrode, and the gate wiring is constituted by a wiring layer and a layer structure that is the same as a layer structure of the gate electrode. The gate wiring means a wiring that transmits a signal to the gate electrode. If the gate electrode has a layer structure, the gate wiring has a wiring layer structure that is the same as the layer structure of the gate electrode. If the gate wiring further includes one or more wiring layers, that is, the gate wiring includes two or more wiring layers and the layers are connected to each other, such a gate wiring has a smaller resistance than that of a gate wiring having the same layer structure as that of the gate electrode. For example, if the wiring layer structure having the same layer structure as that of the gate electrode is defined as a first gate wiring and an additional wiring layer is defined as a second gate wiring, the following configurations are mentioned as a configuration of the gate wiring of the present Embodiment. A configuration in which the second gate wiring is arranged just above the first gate wiring, and a configuration in which an interlayer film is arranged between the first gate wiring and the second gate wiring, and the first and second gate wirings are connected to each other through a contact hole. Similarly, the gate wiring may be composed of three or more wiring layers, and the number of wiring layers that are additionally formed with the layer structure of the gate electrode may be one or two or more.

If the gate electrode has a small thickness of 300 nm or less, a wiring layer that is formed together in the same step of forming the gate electrode, of the wiring layers constituting the gate electrode, has a high resistance. In such a case, one or more wiring layers are further formed in addition to the layer structure of the gate electrode to give a gate wiring composed of two or more layers, which allows the resistance of the gate wiring to be reduced. As a result, a signal delay, heat generation caused by increase in resistance, and the like, can be suppressed. In addition, the reduction in resistance of such a gate wiring also leads to decrease in width of the gate wiring. If wirings in a display portion are formed together in the step of forming the gate wiring, a gate wiring of TFTs for pixel switching in the display portion, a storage capacitor wiring, a storage capacitor electrode, and the like, are formed together in the step of forming the gate wiring to have a two-layer structure. As a result, the reduction in resistance and/or the decrease in wiring width can be achieved. The decrease in wiring width leads to an improvement in aperture ratio of the display portion. It is preferable that each of the gate wiring, the storage capacitor wiring, and the storage capacitor electrode has a resistance of 600Ω/□ or less. As a wiring layer constituting the two-layer structure, a wiring layer formed together in the step of forming the gate electrode, a wiring layer that is formed together in the same step of forming a source electrode, and the like, are mentioned. The respective wiring layers constituting the gate wiring layer may be formed from the same material or different materials.

It is preferable that the gate insulating film contains silicon oxide. It is more preferable that the gate insulating film is a silicon oxide film that is formed using tetraethyl orthosilicate (TEOS) as a raw material gas. Such a gate insulating film containing silicon oxide has a low defect density, and so the generation of fixed charge in the gate insulating film can be suppressed compared with the case the a silicon nitride film, which has a relatively high defect density, is used as the gate insulating film. As a result, the characteristics can be hardly varied among the TFTs.

It is preferable that the gate insulating film contains silicon nitride. The silicon nitride film is considered to easily trap electric charge because of its high defect density. According to the present invention, even if a silicon nitride film is used as the gate insulating film, the characteristics can be hardly varied among the TFTs because the overlapping area is 50 μm² or less and the thickness of the gate electrode is 200 nm or less. The dielectric constant of silicon nitride is about twice that of silicon oxide, typically. So the silicon nitride film may have a thickness substantially twice the thickness of the gate oxide film, if the capacitances of the gate insulating film that is a silicon nitride film and the gate insulating film that is a silicon oxide film are equal. According to this, the resistance to pressure of the gate insulating film can be improved. Further, a silicon nitride/silicon oxide film, which has a two-layer structure composed of a silicon nitride film whose thickness may be increased as an upper layer and a silicon oxide film having a low defect density and excellent interface characteristics as a lower layer, may be used as the gate insulating film.

It is preferable that the gate insulating film has a thickness of 60 nm or less. If the thickness is larger than 60 nm, the electrical capacitance is reduced. So if the overlapping area is reduced to 50 μm² or less, the transistor might not operate stably. It is preferable that the gate insulating film has a thickness of 30 nm or more. If the gate insulating film has a thickness of less than 30 nm, the resistance to pressure of the gate insulating film is reduced, and so the production yield of the circuit board might be reduced. If the gate insulating film has a small thickness, the amount of electric charge per unit of volume, generated in the gate insulating film when the gate electrode is patterned by plasma etching, is increased, and so the characteristics might be varied among the TFTs.

According to the above-mentioned gate insulating film, a gate insulating film may or may not be formed on a source and drain region not overlapping with the gate electrode. If the gate insulating film is formed on the source and drain region, the etching time is short, and so the gate insulating film is less damaged.

The present invention is also a display device including the above-mentioned circuit board. Attributed to the above-mentioned circuit board, a display device including, on a substrate, a monolithic circuit including high-performance TFTs whose characteristics are hardly varied thereamong can be provided. Examples of the display device include a liquid crystal display device and an organic EL display device. Such a display device has a monolithic structure, and so it can be preferably used in high-performance personal digital assistants such as a cellular phone and a PDA.

EFFECT OF THE INVENTION

According to the circuit board and the display device of the present invention, the circuit board including high-performance TFTs where a variation in a threshold voltage and in on-state current is suppressed, and the display device including such a circuit board can be provided.

BRIEF DESCRIPTION OF THE DRAWINGS

FIG. 9-1 is a cross-sectional view schematically showing a configuration of a TFT for explaining a variation in characteristics among TFTs.

FIG. 9-2 is a cross-sectional view schematically showing a configuration of a TFT for explaining a variation in characteristics among TFTs.

FIG. 9-3 is a cross-sectional view schematically showing a configuration of a TFT for explaining a variation in characteristics among TFTs.

FIG. 9-4 is a cross-sectional view schematically showing a configuration of a TFT for explaining a variation in characteristics among TFTs.

DETAILED DESCRIPTION OF THE INVENTION

The present invention is mentioned in more detail below with reference to Embodiments using drawings, but not limited thereto.

Embodiment 1

Figure 1:
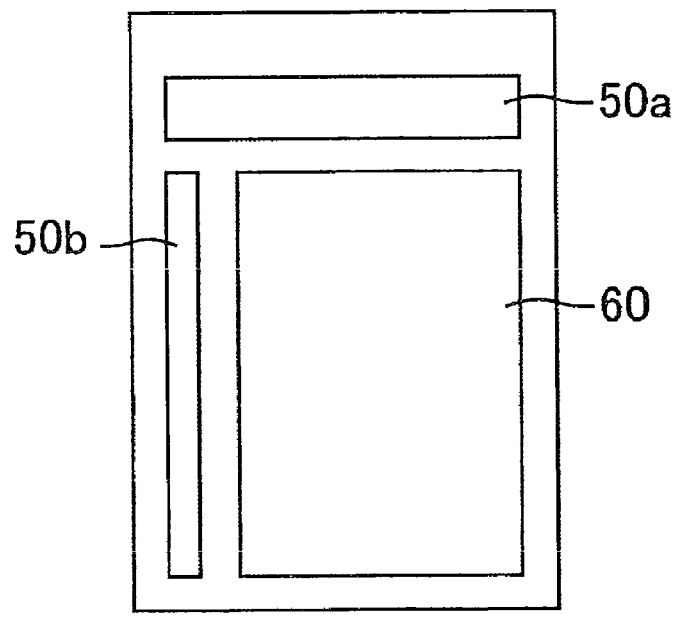
FIG. 1 is a plan view schematically showing a configuration of a circuit board in accordance with Embodiment 1.
Figure 2:
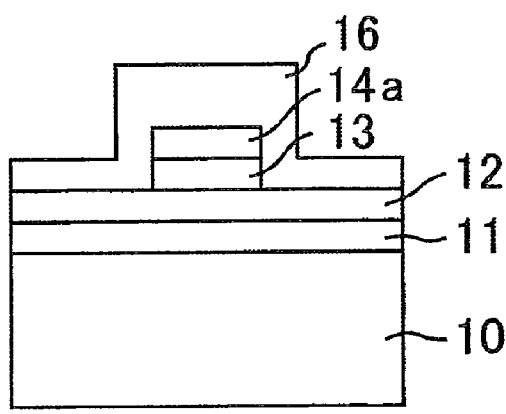
FIG. 2 is a cross-sectional view schematically showing a configuration of a thin film transistor arranged in monolithic circuit portions in FIG. 1.
Figure 3:
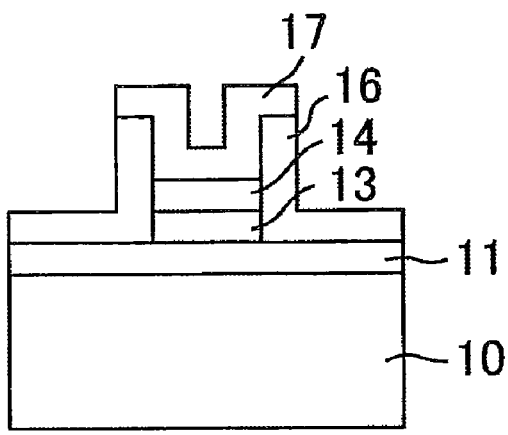
FIG. 3 is a cross-sectional view schematically showing a configuration of a gate wiring in the monolithic circuit portions in FIG. 1.

FIG. 1 is a plan view schematically showing a configuration of a circuit board in accordance with Embodiment 1. FIG. 2 is a cross-sectional view schematically showing a configuration of a thin film transistor (TFT) arranged in monolithic circuit portions 50a and 50b in FIG. 1. FIG. 3 is a cross-sectional view schematically showing a configuration of a gate wiring portion in the monolithic circuit portions 50a and 50b. The circuit board in accordance with Embodiment 1 is included in a display device including a pixel region composed of a plurality of pixels.

A configuration of the TFT is mentioned first.

As shown in FIGS. 1, 2, and 3, the circuit board in accordance with Embodiment 1 includes a pixel region (display portion) 60 and monolithic circuit portions 50a and 50b on a substrate 10. TFTs arranged in the monolithic circuit portions 50a and 50b have the following configuration, as shown in FIG. 2. A base coat film 11 composed of a silicon oxynitride (SiON) film with a thickness of 50 nm and a silicon oxide ($SiO_2$) film with a thickness of 100 nm, stacked in this order; a semiconductor layer 12 that is a polycrystal silicon (p-Si)

film with a thickness of 50 nm; and a gate insulating film 13 that is a SiO$_2$ film with a thickness of 50 nm and that is formed on a channel region of the semiconductor layer 12 are stacked on a substrate 10.

On the gate insulating film 13, a gate electrode 14a composed of a tantalum nitride (TaN) film with a thickness of 30 nm and a tungsten (W) film with a thickness of 170 nm, stacked in this order, is arranged. The gate electrode 14a has a gate length of 2 μm and a gate width of 10 μm. The portion where the gate electrode overlaps with the semiconductor layer 12 has an area of 20 μm$^2$.

On the gate electrode, a cap layer (not shown) that is a SiO$_2$ film with a thickness of 50 nm and an interlayer film 16 having a two-layer structure are stacked in this order. The two-layer structure is composed of a silicon nitride (SiN$_x$) film with a thickness of 250 nm and a SiO$_2$ film with a thickness of 450 nm stacked in this order from the substrate 10 side.

The configuration of the gate wiring in the monolithic circuit portion is mentioned below.

As shown in FIG. 3, in the gate wiring portion in the monolithic circuit portions, the base coat film 11 and the gate insulating film 13 are formed in this order over the entire substrate 10. A first gate wiring 14 is arranged on the gate insulating film 13, and this wiring 14 is formed together when the gate electrode 14a is formed. It is preferable that in the gate wiring portion, the gate wiring does not overlap with a semiconductor layer that is formed in the film-formation and patterning steps for the semiconductor layer constituting the thin film transistors. On the gate electrode 14a, a cap layer (not shown) that is formed together in the step where TFTs in the monolithic circuit boards 50a and 50b are formed and an interlayer film 16 are arranged. In a region just above the first gate wiring 14, neither the cap layer nor the interlayer film 16 are arranged, and a second gate wiring 17 that is formed together when a source electrode (not shown) of the TFT in the monolithic circuit portion is formed is positioned just above the first gate wiring 14 to overlap therewith. This allows a reduction in resistance of the entire wiring. The second gate wiring 17 is arranged not to overlap with the gate electrode 14a.

A production method of the circuit board according to Embodiment 1 is mentioned below.

The substrate 10 is rinsed and pre-annealed as pre-treatments. The substrate 10 is not especially limited, and a glass substrate, a resin substrate, and the like, are preferable in view of costs. The following steps (1) to (11) are performed then.

(1) Step of Forming Base Coat Film

The base coat film 11 is formed by forming a SiON film and a SiO$_2$ film on the substrate 10 by PECVD (plasma enhanced chemical vapor deposition). A mixed gas of monosilane (SiH$_4$), nitrous oxide gas (N$_2$O), and ammonia (NH$_3$), and the like, is mentioned as a raw material gas for forming the SiON film. It is preferable that the SiO$_2$ film is formed using TEOS (tetraethyl ortho silicate) gas as a raw material gas. Instead of the SiO$_2$ film, for example, a silicon nitride (SiN$_x$) film formed using a mixed gas of SiH$_4$ and NH$_3$ as a raw material gas may be used.

(2) Step of Forming Semiconductor Layer

An amorphous silicon (a-Si) film is formed by PECVD and the like. Monosilane (SiH$_4$), disilane (Si$_2$H$_6$), and the like, may be used as a raw material gas for the a-Si film.

The a-Si film formed by PECVD contains hydrogen, and so it is subjected to a treatment for reducing the concentration of the hydrogen (dehydration treatment) at about 500° C. Instead of the dehydration treatment, a metal catalyst may be applied on the a-Si film as a pretreatment for forming a CG (continuous grain)-silicon film. Successively, the a-Si film is melt by laser annealing, and then cooled and solidified to give a p-Si film. According to the present Embodiment, excimer laser annealing is adopted. A heat treatment for solid phase crystallization may be performed as a pretreatment before the laser annealing. Then, the p-Si film is patterned by dry etching using carbon tetrafluoride (CF$_4$) to give a semiconductor layer 12.

(3) Step of Forming Gate Insulating Film

Then, the gate insulating film 13 formed from silicon oxide is formed using TEOS gas as a raw material gas. Use of the silicon oxide film that is formed using TEOS gas allows the characteristics to be hardly varied among TFTs compared with use of the silicon nitride film. The material for the gate insulating film 13 is not especially limited, and a SiN$_x$ film, a SiON film, and the like may be used. The raw material gases mentioned in the base coat film-forming step are mentioned as raw material gases for forming the SiN$_x$ film and the SiON film. The gate insulating film 13 may have a multi-layer body composed of films formed from the above-mentioned materials.

(4) Ion Doping Step

In order to offset the difference in threshold voltage between the Nch-TFT and the Pch-TFT, the entire semiconductor layer 12 is doped with ions. The threshold voltage of the silicon film formed on the substrate 10 is a minus value. By doping the entire semiconductor layer 12 with trivalent atoms such as boron, the threshold voltage of the Pch-transistor can be optimized. There is no need to perform this doping if the threshold voltage of the Pch-TFT does not need to be controlled.

(5) Impurity Implantation Step (Nch TFT Region)

In order to control a threshold of the Nch-TFT, a resist film is formed to cover a region where the Pch-TFT is formed using photolithography and the like, and a gate region of the Nch-TFT of the semiconductor layer 12 is doped with trivalent atom ions such as boron ions. This doping into the gate region is performed to adjust the thresholds between the N channel and P channel. As a result of this doping, the threshold of the N channel is matched to that of the P channel. In addition, as a result of this doping into the gate region, the electrical conductivity of the gate region can be enhanced.

(6) Step of Forming Gate Electrode and First Gate Wiring

A tantalum nitride (TaN) film and a tungsten (W) film are formed by sputtering and the like. Then a resist film is formed on the substrate and patterned into a desired shape by photolithography, and then the tantalum nitride film and the tungsten film are etched by plasma etching with an ICP (inductively coupled plasma) etching device to form the first gate wiring 14.

The ICP etching device is composed of, for example, a processing chamber where a substrate to be treated is accommodated and subjected to etching; an exhaust system for making the inside of the chamber be in a vacuum state; a treatment gas supplying system for supplying treatment gas into the chamber; a dielectric wall installed at an upper space of the chamber; a high frequency antenna that is installed at an upper portion of the dielectric wall to form an induction field for converting the treatment gas into plasma inside the chamber; and a lower electrode (substrate stage) capable of applying a high frequency power that is needed for effectively attracting ions of excited plasma inside the chamber to the substrate to be treated.

An electric power supplied into the high frequency antenna is set at 2000 W; a bias power supplied into a substrate stage at 500 W; a pressure inside the chamber at 2.0 Pa; a flow rate of tetrafluoromethane (CF$_4$) gas at 200 cm$^3$/min; a flow rate of chlorine (Cl$_2$) gas at 100 cm$^3$/min; and a flow rate of oxygen ($O_2$) gas at 200 cm³/min. The tungsten film is etched by dry etching using a resist as a mask. As a result, a tungsten layer that is an upper layer constituting the gate electrode 14a is formed. In this case, a selective ratio (ratio of etching rate) of the tungsten film to the tantalum nitride film is 10 or more.

Then, an electric power supplied into the high frequency antenna is set at 2000 W; a bias power supplied into the substrate stage at 150 W; a pressure inside the chamber at 2.0 Pa; a flow rate of $CF_4$ gas at 100 cm³/min; and a flow rate of $Cl_2$ gas at 100 cm³/min. The tantalum nitride film is etched by dry etching using a resist as a mask to give a tantalum nitride layer that is a lower layer constituting the gate electrode 14a. Thus, a gate electrode having a two-layer structure composed of the tungsten layer and the tantalum nitride layer is formed. Etching end-points for the tungsten film and tantalum nitride film are detected with an end-point detector that detects a change of plasma emission spectrum. The tantalum nitride film is over-etched for about 10 seconds longer than its etching end point in order to suppress film remaining. In view of suppression of damages from plasma, a shorter over-etching time is better. The flow rates of the respective gases are values measured at 1013 Pa and 0° C.

The gate electrode 14a is formed together when the first gate wiring 14 is formed. In such a case, the thickness of the gate electrode 14a is set at 200 nm or less, which can shorten the etching time. As a result, electric charge can be prevented from generating in the gate insulating film 13. The gate electrode 14a is formed to have a gate length of 2 μm and a gate width of 10 μm. As the metal film constituting the gate electrode 14a, films formed from low-resistant metals such as tantalum (Ta), molybdenum (Mo), molybdenum tungsten (MoW), and aluminum (Al); and films that have a flat surface and that are formed from high-melting-point metals with stable characteristics, are mentioned, for example. The gate electrode 14a may have a multi-layer body composed of films formed from the above-mentioned materials.

(7) Step of Forming Source and Drain Regions

In order to form source and drain regions of the Nch-TFT and the Pch-TFT, a resist film is patterned into a desired shape by photolithography, and then a region that is to constitute the source-drain region of the Nch-TFT is doped with a high concentration of pentavelent atom ions such as phosphorus ions and a region that is to constitute the source-drain region of the Pch-TFT is doped with a high concentration of trivalent atom ions such as boron ions. If necessary, an LDD (lightly doped drain) structure may be formed. The semiconductor layer 12 is subjected to a thermal activation treatment for 5 minutes at about 700° C. to activate the impurity ions contained therein. As a result, the electrical conductivity of the source-drain region can be enhanced. For the activation, radiation of excimer laser may be employed, for example.

(8) Step of Forming Cap Layer and Interlayer Film

Then, a cap layer (not shown) that is a $SiO_2$ film is formed by PECVD using TEOS as a raw material gas, and successively, the interlayer film 16 is formed on the entire substrate. A SiNx film, a SiON film, and the like, can be used as a material for the cap layer (not shown) and the interlayer film 16.

(9) Step of Forming Contact Hole

Then, a resist film is formed on the interlayer film 16 by spin coating and the like. The resist film is patterned into a desired shape by photolithography, and then, the cap layer (not shown), the interlayer film 16, and the gate insulating film 13 are wet-etched using a fluorine acid etching solution to provided with a contact hole for connecting the source-drain electrode (not shown) to the source-drain region of the semiconductor layer 12. Dry-etching may be used instead of the wet-etching. The cap layer and the interlayer film 16 that are positioned above the region where the first gate wiring 14 is arranged are also etched. As a result, in a step of forming the source-drain electrode, mentioned below, the second gate wiring 17 can be formed just above the first gate wiring 14 to overlap therewith.

(10) Hydrogen Termination Step

Hydrogen termination of an interface between the channel portion of the semiconductor layer 12 and the gate insulating film 13 is performed by heat treatment for 1 hour at about 400° C. Hydrogen existing in the silicon nitride film that constitutes the interlayer film 16 is used for the termination.

(11) Step of Forming Source-Drain Electrode and Second Gate Wiring

A titanium (Ti) film, an aluminum (Al) film, a Ti film are formed in this order by sputtering, and the like. A resist film is formed into a desired pattern by photolithography, and then, the metal multi-layer film of Ti/Al/Ti is patterned by dry etching, thereby forming a source-drain electrode. The source-drain electrode and the source-drain region are conducted to each other through a contact hole formed in the cap layer (not shown), the interlayer insulating film 16, and the gate insulating film 13. The second gate wiring 17 is formed just above the first gate wiring 14, which allows the resistance of the gate wiring to be reduced.

Through the above steps, high-performance TFTs the circuit board of the present invention includes are completed. Simultaneously with these TFTs, those in pixel regions also can be formed.

Embodiment 2

A circuit board in accordance with Embodiment 2 has the same configuration as in Embodiment 1, except that TFTs are formed to have a gate length of 3 μm, a gate width of 10 μm, and an overlapping area of 30 μm².

Embodiment 3

A circuit board in accordance with Embodiment 3 has the same configuration as in Embodiment 1, except that TFTs are formed to have a gate length of 3.5 μm, a gate width of 10 μm, and an overlapping area of 35 μm² are formed.

Embodiment 4

A circuit board in accordance with Embodiment 4 has the same configuration as in Embodiment 1, except that TFTs include a gate electrode with a thickness of 300 nm.

Embodiment 5

A circuit board in accordance with Embodiment 5 has the same configuration as in Embodiment 2, except that TFTs include a gate electrode having a film thickness of 300 nm.

Embodiment 6

The circuit board in accordance with Embodiment 6 has the same configuration as in Embodiment 3, except that TFTs include a gate electrode with a film thickness of 300 nm.

Comparative Embodiment 1

A circuit board in accordance with Comparative Embodiment 1 has the same configuration as in Embodiment 1, except that TFTs arranged in a monolithic circuit portion include a gate electrode with a thickness of 370 nm. The plasma etching for the gate electrode is performed under the same conditions as in Embodiment 1. The etching end-point is determined with the end-point detector.

Comparative Embodiment 2

A circuit board in accordance with Comparative Embodiment 2 has the same configuration as in Embodiment 2, except that TFTs arranged in a monolithic circuit portion include a gate electrode with a thickness of 370 nm.

Comparative Embodiment 3

A circuit board in accordance with Comparative Embodiment 3 has the same configuration as in Embodiment 3, except that TFTs arranged in a monolithic circuit portion include a gate electrode with a thickness of 370 nm.

Comparative Embodiments 4, 5, and 6

A circuit board in accordance with Comparative Embodiment 4 has the same configuration as in Embodiment 1, except that TFTs in a monolithic circuit portion are formed to have a gate length of 5 μm, a gate width of 10 μm, and an overlapping area of 50 μm. The gate electrode has a thickness of 200 nm. Circuit boards in accordance with Comparative Embodiments 5 and 6 have the same configuration as in Comparative Embodiment 4, except that TFTs in a monolithic circuit portion include a gate electrode with a thickness of 300 nm (Comparative Embodiment 5) and a thickness of 370 nm (Comparative Embodiment 6).

Comparative Embodiments 7, 8, and 9

A circuit board in accordance with Comparative Embodiment 7 has the same configuration as in Embodiment 1, except that TFTs arranged in a monolithic circuit portion include a gate electrode having a gate length of 8 μm, a gate width of 10 μm, and an overlapping area of 80 μm. The gate electrode has a thickness of 200 nm. Circuit boards in accordance with Comparative Embodiments 8 and 9 have the same configuration as in Comparative Embodiment 7, except that TFTs arranged in a monolithic circuit portion include a gate electrode with a thickness of 300 nm (Comparative Embodiment 8) and a thickness of 370 nm (Comparative Embodiment 9).

Evaluation of Embodiments 1 to 6 and Comparative Embodiments 1 to 9

Figure 4:
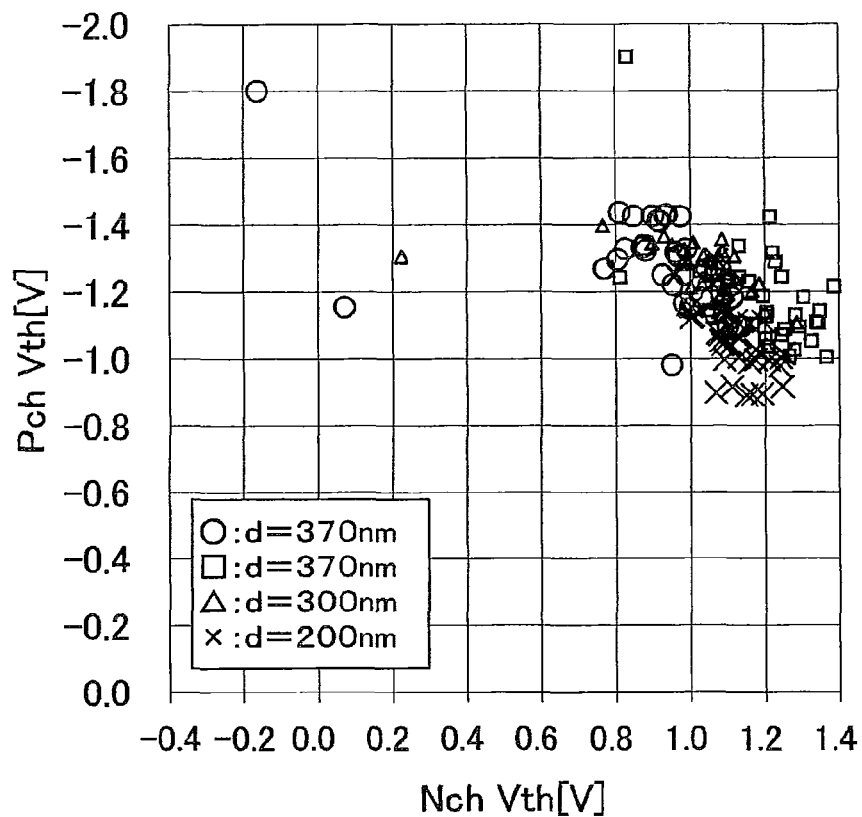
FIG. 4 is a diagram showing a variation in $V_{th}$ among thin film transistors formed on each of circuit boards in accordance with Embodiments 1 and 4, and Comparative Embodiment 1.

FIG. 4 is a diagram showing measurement results of threshold voltage ($V_{th}$) of Pch- and Nch-TFTs adjacent to each other with a distance of 500 μm or less on the same substrate, in each of the circuit boards in accordance with Embodiments 1 and 4 and Comparative Embodiment 1. In FIG. 4, the horizontal axis shows $V_{th}$ of the Nch-TFT and the vertical axis shows $V_{th}$ of the Pch-TFT. The symbol x shows measurement results of the circuit board in accordance with Embodiment 1. The symbol Δ shows those of the circuit board in accordance with Embodiment 4. The symbols □ and ○ are measurement results of the circuit board in accordance with Comparative Embodiment 1. The symbols □ and ○ are those of different two circuit boards produced in the same step. The plural points represented by the same symbol show $V_{th}$ values that were measured at various positions on the same circuit board.

As shown in FIG. 4, the variation in $V_{th}$ value was small in both of the circuit boards of Embodiments 1 and 2 where the thicknesses d of the gate electrode were 200 nm and 300 nm, respectively. In contrast, in the circuit board of Comparative Embodiment 1 where the thickness d of the gate electrode was 370 nm, the variation in $V_{th}$ value was large.

Figure 5:
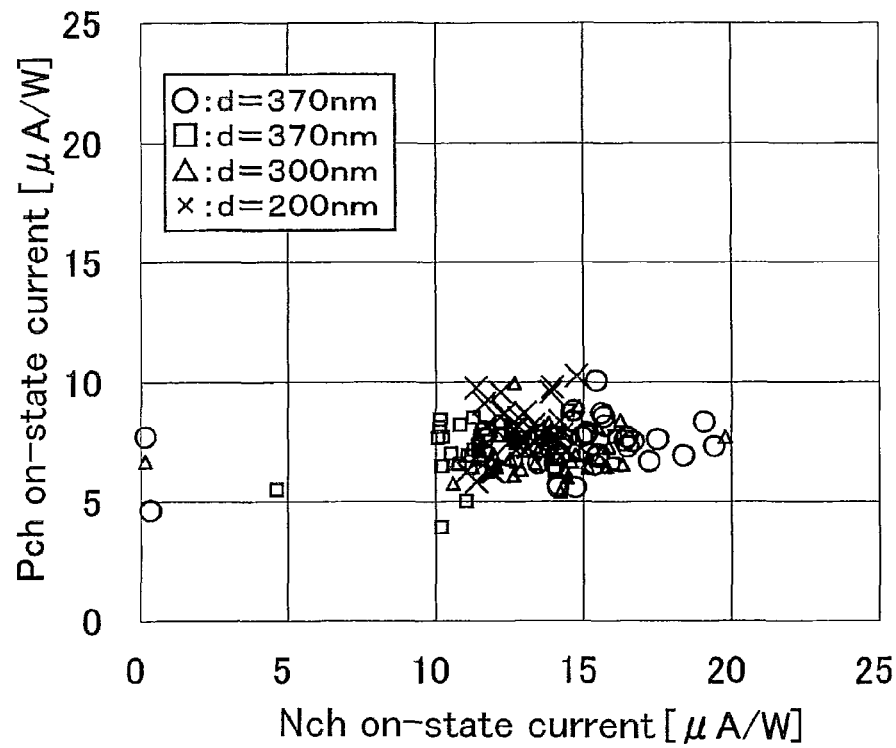
FIG. 5 is a diagram showing a variation in on-state current among thin film transistors formed on each of circuit boards in accordance with Embodiments 1 and 4 and Comparative Embodiment 1.

FIG. 5 is a diagram showing measurement results of on-state current ($I_{on}$) of Pch- and Nch-TFTs adjacent to each other with a distance of 500 μm or less on the same substrate, in each of the circuit boards in accordance with Embodiments 1 and 4 and Comparative Embodiment 1. The horizontal axis shows $I_{on}$ of the Nch-TFT and the vertical axis shows $I_{on}$ of the Pch-TFT. Similarly to the case shown in FIG. 4, the symbols x, Δ, ○, and □ show measurement results of the circuit board of Embodiment 1, the circuit board of Embodiment 4, and the two circuit boards produced under the same conditions as in Comparative Embodiment 1, respectively.

As shown in FIG. 5, in the circuit boards in accordance with Embodiments 1 and 2 where the thicknesses d of the gate electrode are 200 nm for Embodiment 1 and 300 nm for Embodiment 2, the variation in $I_{on}$ is small. In contrast, in the circuit board of Comparative Embodiment 1 where the thickness d of the gate electrode is 370 nm, the variation in $I_{on}$ is large.

Figure 6:
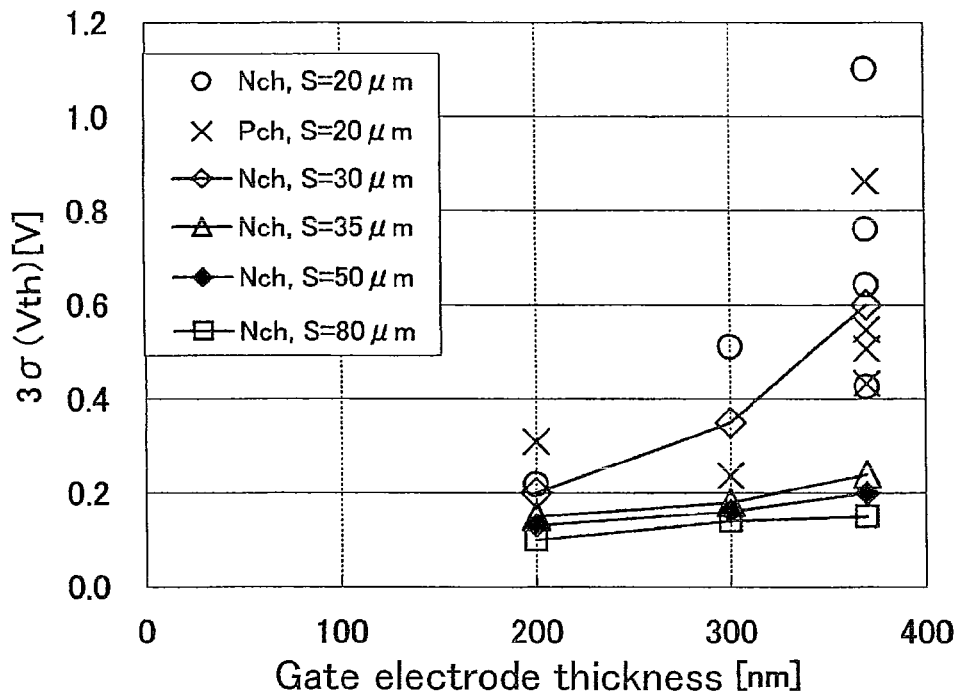
FIG. 6 is diagram showing an in-plane variation in $V_{th}$ among thin film transistors formed on each of circuit boards in accordance with Embodiments 1 to 6 and Comparative Embodiments 1 to 9.

FIG. 6 is a diagram showing an in-plane variation $3\sigma(V_{th})$ in $V_{th}$ in each of the circuit boards in Embodiments 1 to 6 and Comparative Embodiments 1 to 9, on the basis of $V_{th}$ values at plural positions of the Pch- and Nch-TFTs formed in the same step. The $3\sigma(V_{th})$ shows a value three times larger than a standard deviation on the basis of $V_{th}$ values measured at 255 positions in the same substrate plane. The horizontal axis shows a gate electrode thickness. The vertical axis shows the 3σ value. The symbol ○ shows measurement values corresponding to the gate electrode thicknesses of 200 nm in Embodiment 1, 300 nm in Embodiment 4, and 370 nm in Comparative Embodiment 1 with the overlapping area of the Nch-TFT being 20 μm². The symbol x shows measurement values corresponding to the gate electrode thickness of 200 nm in Embodiment 1, 300 nm in Embodiment 4, and 370 nm in Comparative Embodiment 1 with the overlapping area of the Pch-TFT being 20 μm². The symbol ◇ shows measurement values corresponding to the gate electrode thickness of 200 nm in Embodiment 2, 300 nm in Embodiment 5, and 370 nm in Comparative Embodiment 2 with the overlapping area of the Nch-TFT being 30 μm². The symbol Δ shows measurement values corresponding to the gate electrode thickness of 200 nm in Embodiment 3, 300 nm in Embodiment 6, and 370 nm in Comparative Embodiment 3 with the overlapping area of the Nch-TFT being 35 μm². The symbol ◆ shows measurement values corresponding to the gate electrode thickness of 200 nm in Comparative Embodiment 4, 300 nm in Comparative Embodiment 5, and 370 nm in Comparative Embodiment 6 with the overlapping area of the Nch-TFT being 50 μm². The symbol □ shows measurement values corresponding to the gate electrode thickness of 200 nm in Comparative Embodiment 7, 300 nm in Comparative Embodiment 8, and 370 nm in Comparative Embodiment 9 with the overlapping area of the Nch-TFT being 80 μm².

As shown in FIG. 6, when the overlapping areas s are 50 μm² and 80 μm², the $3\sigma(V_{th})$ values are small regardless of a change of the gate electrode thickness, which shows that the $V_{th}$ is hardly varied among the TFTs. When the overlapping area s is 35 μm², the $3\sigma(V_{th})$ value begins to increase after the gate electrode thickness exceeds 370 nm, which shows that the $V_{th}$ begins to be varied among the TFTs. When the overlapping areas s are 20 μm² and 30 μm², the $V_{th}$ is hardly varied when the gate electrode thickness is 200 nm, but as the thickness increases, the $3\sigma(V_{th})$ becomes larger, which shows that in each circuit board, the $3\sigma(V_{th})$ value begins to be varied among the TFTs.

Figure 7:
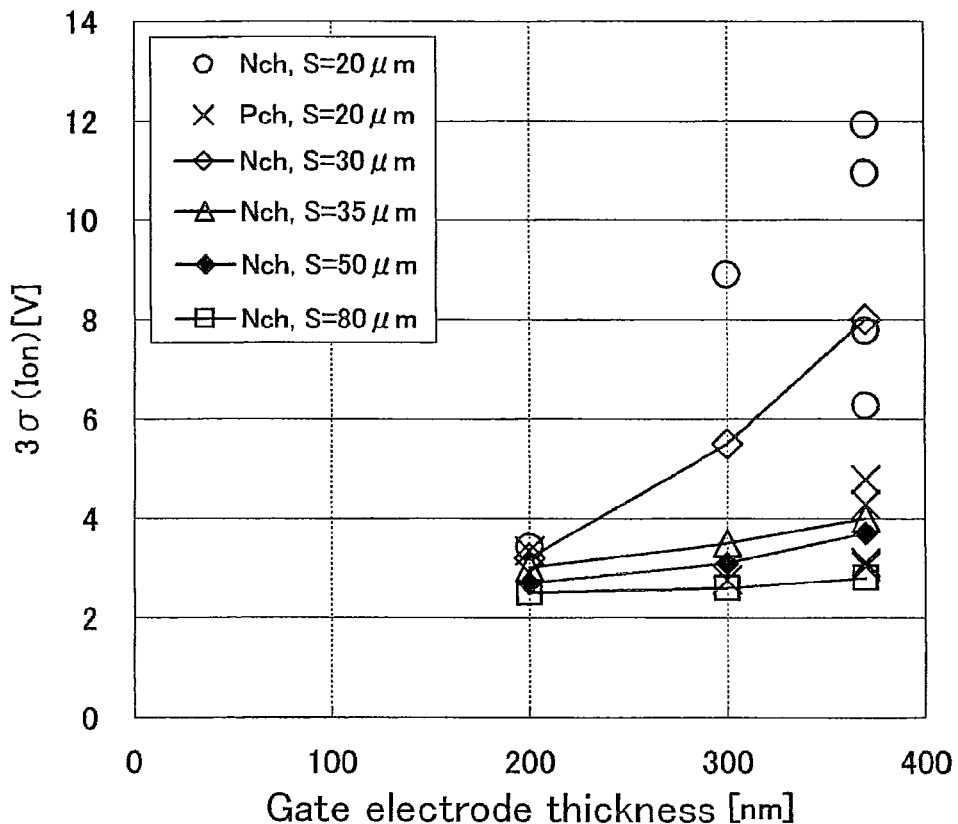
FIG. 7 is a diagram showing an in-plane variation in on-state current among thin film transistors formed on each of circuit boards in accordance with Embodiments 1 to 6 and Comparative Embodiments 1 to 9.

FIG. 7 is a diagram showing an in-plane variation $3\sigma(I_{on})$ of $I_{on}$ in each of the circuit boards in Embodiments 1 to 6 and Comparative Embodiments 1 to 9, on the basis of $I_{on}$ values at plural positions of the Pch- and Nch-TFTs formed in the same step. The $3\sigma(I_{on})$ shows a value of a standard deviation of $I_{on}$ on the basis of $I_{on}$ values measured at 255 positions in the same substrate plane. The horizontal axis shows a gate electrode thickness. The vertical axis shows a $3\sigma(I_{on})$ value. The symbols ○, x, ◇, △, ♦, and □ show measurement results of the circuit boards of the corresponding Embodiments or Comparative Embodiments as mentioned in FIG. 6.

As shown in FIG. 7, if the overlapping area s is 50 μm² or 80 μm², the $3\sigma(I_{on})$ values are small regardless of a change of the gate electrode thickness. When the overlapping area s is 35 μm², the $3\sigma(V_{th})$ value begins to increase after the gate electrode thickness exceeds 370 nm, which shows that the $V_{th}$ begins to be varied among the TFTs. When the overlapping area s is 20 μm² or 30 μm², the $I_{on}$ is hardly varied when the gate electrode thickness is 200 nm, but as the thickness increase, the $3\sigma(I_{on})$ becomes larger, which shows that in each circuit board, the $3\sigma(I_{on})$ value begins to be varied among the TFTs.

Figure 8:
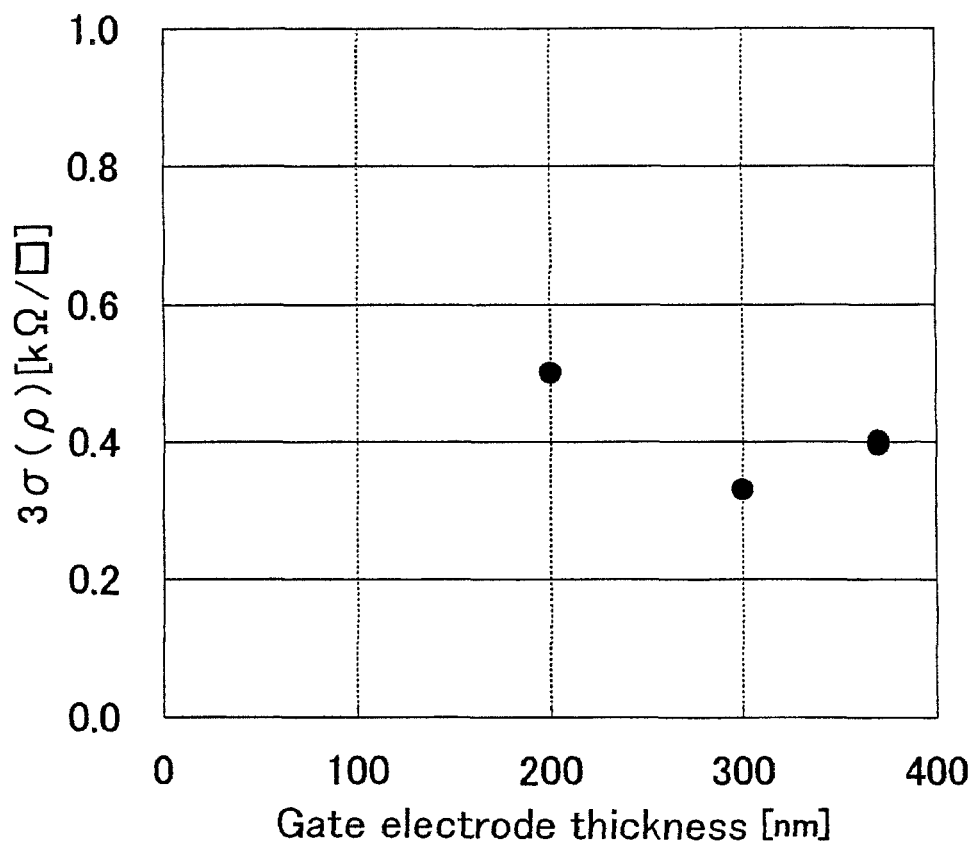
FIG. 8 is a diagram showing a variation in a resistance of an N-ch region with change in the thickness of the gate electrode.

FIG. 8 is a diagram showing a three times standard deviation $3\sigma(\rho)$ on the basis of resistance values at 255 positions in the same substrate plane of plural Nch-regions, formed in the same step, in each of the circuit boards of Embodiments 1 and 4, and Comparative Embodiment 1. In a region with a distance of 1 cm or less from the TFT that is measured for the $V_{th}$ and $I_{on}$ values, a TEG (test element group) for measuring a sheet resistance of a source-drain is located, and thereby the Nch-region is measured for resistance value by a 4 terminal method. In this case, the variation in the resistance value of the Nch-region can be identified with that in a region between the source region and the drain region under no voltage application to the gate electrode. The measurement is performed with the overlapping area being 20 μm² and the thickness of the gate electrode being 200, 300, or 370 nm. As shown in FIG. 8, the change of the $3\sigma(\rho)$ value is independent on the gate electrode thickness. Among the TFTs different in gate electrode thickness, the variation in resistance value of the gate region has no dependence on the gate electrode thickness, and so the variation in characteristics among the TFTs is considered to be due to the generation of electric charge in the gate insulating film.

Examination of the Reason for the Characteristics Variation

The results shown in FIGS. 4 to 8 show that the $V_{th}$ and $I_{on}$ values of the TFT having an overlapping area of 40 μm² or less are varied, and this variation in characteristics is not observed in the TFT with a large overlapping area. This shows that the variation in characteristics is a phenomenon peculiar to the TFT having a small overlapping area. The variation in the $V_{th}$ and $I_{on}$ values is more markedly observed when the overlapping area is 30 μm, and it is still more markedly observed when the overlapping area is 20 μm² or less. Such a variation in characteristics can be suppressed by reducing the thickness of the gate electrode to 300 nm or less, and it can be more suppressed when the gate electrode has a thickness of 200 nm or less.

The following phenomenon appears to occur, in view of the above-mentioned results.

Figures 1, 9:
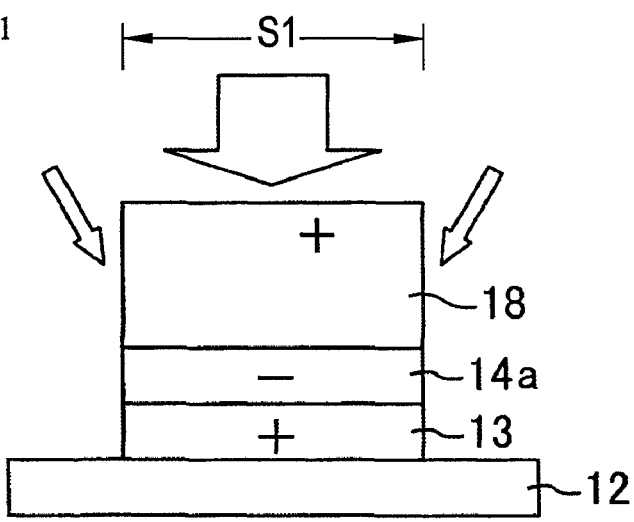
Figures 2, 9:
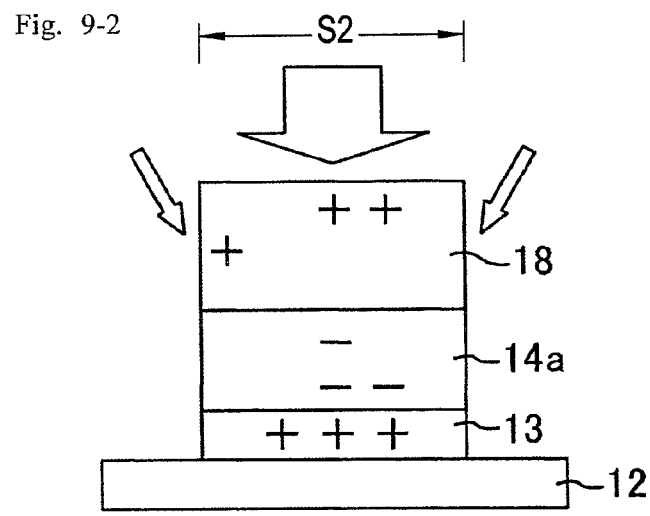
Figures 3, 9:
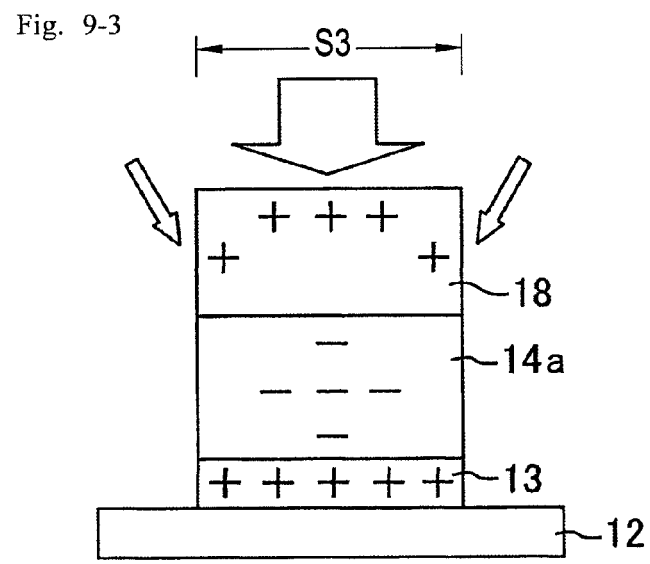
Figures 4, 9:
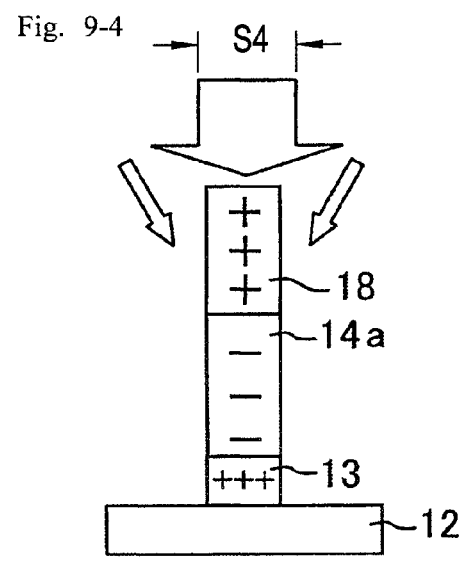
Figure 10:
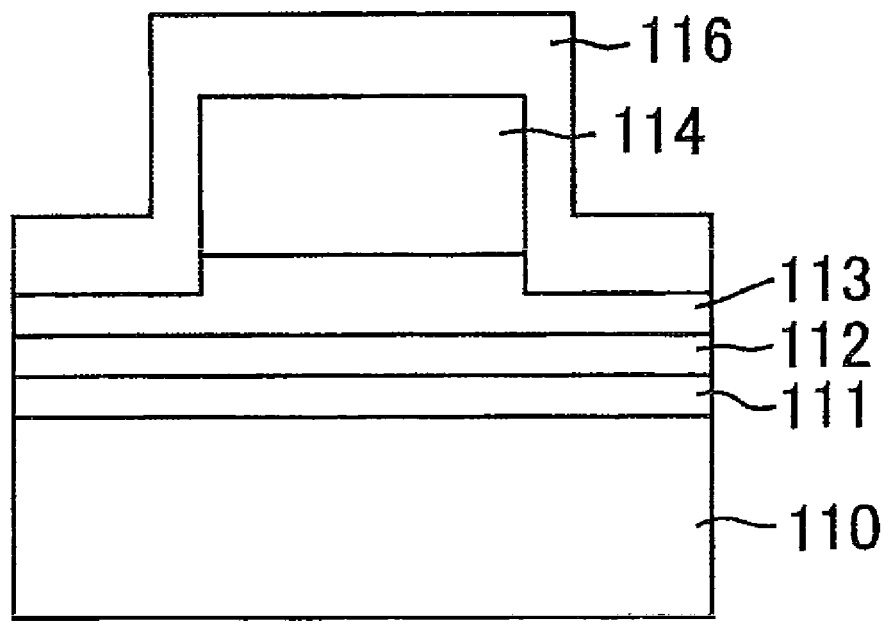
FIG. 10 is a cross-sectional view schematically showing a TFT used in a conventional pixel electrode.
Figure 11:
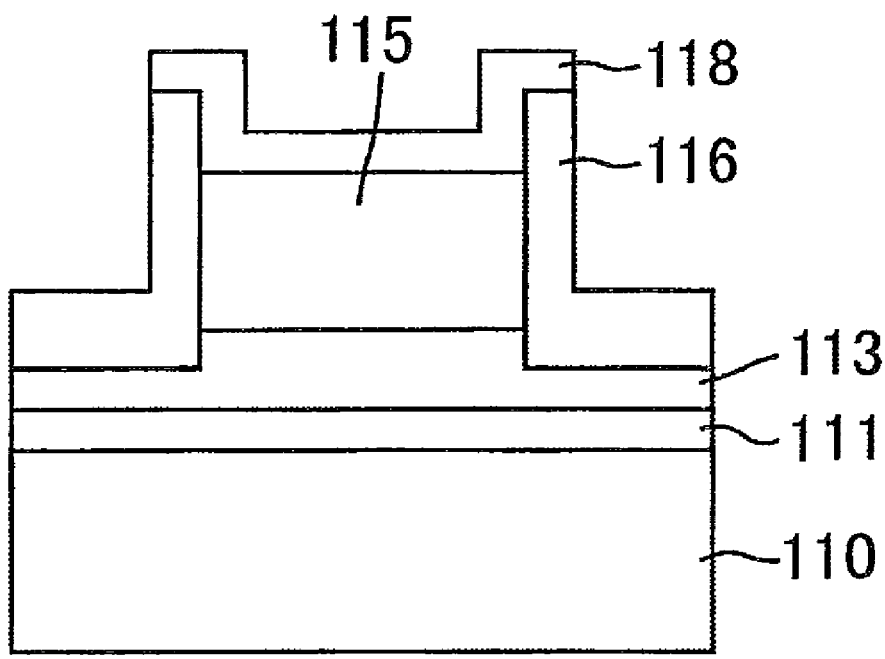
FIG. 11 is a cross-sectional view schematically showing a gate wiring composed of two layers, formed in a conventional pixel region.

With reference to FIGS. 9-1 to 9-4, the reason for the variation in TFT characteristics is mentioned.

FIGS. 9-1 to 9-4 are cross-sectional views schematically showing configurations of TFTs different in the overlapping area and the film thickness. These TFTs are configured that the gate insulating film 13, the gate electrode 14a, and the resist 18 are stacked in this order on the semiconductor layer 12. The thicknesses of the gate electrode 14a in FIGS. 9-1, 9-2, 9-3, and 9-4 are d1, d2, d3, and d4, respectively, and the overlapping areas are s1, s2, s3, and s4, respectively. Among the TFTs, the relationship of the gate electrode thickness satisfies d1<d2<d3=d4, and that of the overlapping area satisfies s1=s2=s3>s4. In the drawings, "+" and "−" show a positive charge and a negative charge in the film, respectively. The white arrow in the drawings shows ions implanted when the gate electrode is patterned by plasma etching.

The gate electrode 14a is patterned by plasma etching, and on the gate electrode 14a, the resist 18 is formed. Ions in plasma are implanted into the resist 18 when the plasma etching is performed, and the resist 18 is positively charged. Then, the gate electrode 14a is negatively charged by induction of the charge. As a result, the positive charge in the gate insulating film 13 is generated, and as a result, the characteristics are varied among the TFTs. This mechanism supports the results shown in FIGS. 4 to 8, i.e., as the thickness of the gate electrode is large and as the overlapping area is small, the variation in characteristics among the TFTs is large.

In the TFT shown in FIG. 9-1, the thickness of the gate electrode 14a is small, and so the time for plasma etching is short. As a result, the amount of generation of electric charge in the gate insulating film 13 is small. According to the TFTs shown in FIGS. 9-2 and 9-3, the thickness of the gate electrode 14a is large, and so the time for plasma etching is long. As a result, the amount of generation of the electric charge in the gate insulating film 13 increases. If a TFT having an overlapping area like the TFT shown in FIG. 9-4 is formed, the resist 18 on the gate electrode 14a has a large opening area per unit volume, and so the amount of implantation of electric charge in the gate electrode 14a is large and the electric charge is easily generated in the gate insulating film 13. The amount of electric charge per unit volume in the gate insulating film 13 is large, and this is considered to cause the variation in characteristics.

For the above-mentioned reason, if the overlapping area is small, the generation of electric charge in the gate insulating film can be suppressed by decreasing the thickness of the gate electrode. As a result, TFTs whose characteristics are hardly varied can be formed.

EXPLANATION OF NUMERALS AND SYMBOLS 10, 110: Glass substrate
11, 111: Base coat film
12, 112: Semiconductor layer
13, 113: Gate insulating film
14: First gate wiring
14a, 114: Gate electrode
15: Cap layer
16, 116: Interlayer insulating film
17: Second gate wiring
18: Resist
50a, 50b: Monolithic circuit portion
60: Pixel region (display portion)
100: Circuit board
115: First gate wiring
118: Second gate wiring

The invention claimed is:

1. A circuit board, comprising:
a monolithic circuit including a thin film transistor on a substrate,
wherein the thin film transistor includes a semiconductor layer, a gate insulating film formed on the semiconductor layer, and a gate electrode formed on the gate insulating film,
a portion of the thin film transistor where the gate electrode overlaps with the semiconductor layer has an area of 40 $\mu m^2$ or less, and
the gate electrode has a thickness of 300 nm or less, and has an entirely flat bottom surface,
wherein the semiconductor layer and the gate insulating film are sandwiched between an upper surface of the substrate and the flat bottom surface of the gate electrode.

2. The circuit board according to claim 1,
wherein the gate electrode has a thickness of 200 nm or less.

3. The circuit board according to claim 1,
wherein the circuit board includes a gate wiring connected to the gate electrode, and the gate wiring includes,
a first gate wiring, which is formed when the gate electrode is formed, and
a second gate wiring.

4. The circuit board according to claim 1,
wherein the gate insulating film contains silicon oxide.

5. The circuit board according to claim 1, wherein the gate insulating film contains silicon nitride.

6. A display device, comprising:
the circuit board according to claim 1.

* * * * *